US012772751B2

(12) United States Patent
Ristic

(10) Patent No.: US 12,772,751 B2
(45) Date of Patent: Oct. 20, 2026

(54) GROWTH SUBSTRATE AND METHOD FOR MANUFACTURING AN OPTOELECTRONIC SEMICONDUCTOR BODY

(71) Applicant: ams-OSRAM International GmbH, Regensburg (DE)

(72) Inventor: Jelena Ristic, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 329 days.

(21) Appl. No.: 18/546,063

(22) PCT Filed: Mar. 2, 2022

(86) PCT No.: PCT/EP2022/055282

§ 371 (c)(1),
(2) Date: Aug. 10, 2023

(87) PCT Pub. No.: WO2022/194558

PCT Pub. Date: Sep. 22, 2022

(65) Prior Publication Data

US 2024/0136176 A1 Apr. 25, 2024
US 2024/0234136 A9 Jul. 11, 2024

(30) Foreign Application Priority Data

Mar. 19, 2021 (DE) ......................... 102021202708.3

(51) Int. Cl.
*H10P 14/20* (2026.01)
*H10F 71/00* (2025.01)
*H10H 20/01* (2025.01)

(52) U.S. Cl.
CPC ..... *H10P 14/3252* (2026.01); *H10F 71/1276* (2025.01); *H10F 71/1278* (2025.01);
(Continued)

(58) Field of Classification Search
CPC ........... H01L 21/0251; H01L 21/02507; H01L 21/7813; H01L 21/7806; H01L 21/02568;
(Continued)

(56) References Cited

U.S. PATENT DOCUMENTS

2012/0187540 A1 7/2012 Hooper et al.
2017/0047407 A1* 2/2017 Weeks, Jr. ........... H10D 62/405
(Continued)

FOREIGN PATENT DOCUMENTS

WO 2016085890 A1 6/2016

OTHER PUBLICATIONS

Yu, J. et al., "Van der Waals Epitaxy of III-Nitride Semiconductors Based on 2D Materials for Flexible Applications," Progress Report, Advanced Materials, DOI: 10.1002/adma.201903407, Sep. 5, 2019, 26 pages.

(Continued)

*Primary Examiner* — Alia Sabur
(74) *Attorney, Agent, or Firm* — Slater Matsil, LLP

(57) ABSTRACT

In an embodiment a growth substrate includes a substrate and a buffer layer sequence having a plurality of semiconductor layers based on a nitride semiconductor compound material and a plurality of buffer layers, wherein the semiconductor layers and the buffer layers are arranged alternatingly, and wherein the buffer layers comprise at least one of the following two-dimensional layered materials: graphene, boron nitride, $MoS_2$, $WSe_2$ or fluorographene.

20 Claims, 3 Drawing Sheets

(52) U.S. Cl.
CPC .. *H10H 20/0125* (2025.01); *H10H 20/01335* (2025.01); *H10H 20/0137* (2025.01); *H10P 14/2904* (2026.01); *H10P 14/2905* (2026.01); *H10P 14/2908* (2026.01); *H10P 14/2922* (2026.01); *H10P 14/3206* (2026.01); *H10P 14/3216* (2026.01); *H10P 14/3236* (2026.01); *H10P 14/3416* (2026.01)

(58) Field of Classification Search
CPC .............. H10H 20/0137; H10H 20/815; C30B 25/183; C30B 25/02
See application file for complete search history.

(56) References Cited

U.S. PATENT DOCUMENTS

| | | | | |
|---|---|---|---|---|
| 2017/0141263 | A1 | 5/2017 | Yang et al. | |
| 2017/0260651 | A1 | 9/2017 | Robinson et al. | |
| 2019/0189840 | A1* | 6/2019 | Tsai | H10D 62/118 |
| 2019/0259608 | A1* | 8/2019 | Kim | H01L 21/02485 |
| 2022/0216109 | A1* | 7/2022 | Snure | H01L 21/7813 |

OTHER PUBLICATIONS

Zhao, C. et al., "Novel III-V Semiconductor Epitaxy for Optoelectronic Devices Through Two-Dimensional Materials," Progress in Quantum Electronics, Elsevier, Dec. 8, 2020, 20 pages.

* cited by examiner

GROWTH SUBSTRATE AND METHOD FOR MANUFACTURING AN OPTOELECTRONIC SEMICONDUCTOR BODY

CROSS-REFERENCE TO RELATED APPLICATIONS

This patent application is a national phase filing under section 371 of PCT/EP2022/055282, filed Mar. 2, 2022, which claims the priority of German patent application 10 2021 202 708.3, filed Mar. 19, 2021, each of which is incorporated herein by reference in its entirety.

TECHNICAL FIELD

A growth substrate for the epitaxial growth of an epitaxial semiconductor layer sequence based on a semiconductor compound material and a method for manufacturing an optoelectronic semiconductor body are provided.

SUMMARY

Embodiments provide a growth substrate for epitaxial growth of an epitaxial semiconductor layer sequence based on a semiconductor compound material, wherein an improved crystal quality of the epitaxial semiconductor layer sequence can be achieved.

Further embodiments provide a method for manufacturing a semiconductor body having an epitaxial semiconductor layer sequence based on a semiconductor compound material, the epitaxial semiconductor layer sequence having an improved crystal quality.

According to an embodiment, the growth substrate is configured for epitaxial growth of an epitaxial semiconductor layer sequence based on a semiconductor compound material. In particular, a semiconductor compound material is a chemical compound of at least two different chemical elements.

According to a further embodiment of the growth substrate, the semiconductor compound material is a III/V semiconductor compound material. In other words, the semiconductor layer sequence can comprise a III/V semiconductor compound material or can consist of a III/V semiconductor compound material. A III/V semiconductor compound material comprises group III elements GIII(1), GIII(2), GIII(3) and a group V element GV and has the general formula $GIII(1)_xGIII(2)_yGIII(3)_{1-x-y}GV$ with $0 \leq x \leq 1$, $0 \leq y \leq 1$ and $x+y \leq 1$.

According to a further embodiment of the growth substrate, the semiconductor compound material is a II/VI semiconductor compound material. In other words, the semiconductor layer sequence can comprise a II/VI semiconductor compound material or can consists of a II/VI semiconductor compound material.

A II/VI semiconductor compound material comprises group II elements and/or group XII elements GII(1), GII(2) and group VI elements GVI(1), GVI(2). Particularly, a II/VI semiconductor compound material can be a binary compound with the chemical formula (GII(1)GVI(1)) or a ternary compound with the chemical formula GII(1)(GVI(1), GVI(2)) or (GII(1),GVI(1))GVI(2).

According to a further embodiment, the growth substrate comprises a substrate. For example, the substrate is responsible for the mechanical stability of the growth substrate. In particular, the substrate is thicker than a buffer layer sequence. Further, the substrate is preferably a single crystal and not epitaxial grown.

According to a further embodiment, the growth substrate comprises a buffer layer sequence. The buffer layer sequence comprises at least one semiconductor layer and at least one buffer layer. The semiconductor layer is based on a semiconductor compound material or consists of a semiconductor compound material.

Preferably, the semiconductor layer is based on a semiconductor compound material from the same material system as the epitaxial semiconductor layer sequence to be grown on the growth substrate or consists of a semiconductor compound material of the same material systems as the epitaxial semiconductor layer sequence to be grown on the growth substrate.

Particularly preferably, the semiconductor layer is based on the same semiconductor compound material as the epitaxial semiconductor layer sequence to be grown on the growth substrate or consists of the same semiconductor compound material as the epitaxial semiconductor layer sequence to be grown on the growth substrate.

The buffer layer is based on a two-dimensional layered material or consists of a two-dimensional layered material. Particularly, two-dimensional layered materials comprises a plurality of monolayers of covalently bound elements, said monolayers of covalently bound elements are stacked above each other and bound to each other by weak Van der Waals forces.

According to a preferred embodiment, the growth substrate for the epitaxial growth of an epitaxial semiconductor layer sequence based on a semiconductor compound material, comprises a substrate, and a buffer layer sequence, said buffer layer sequence comprises at least one semiconductor layer based on the semiconductor compound material of the epitaxial semiconductor layer sequence to be grown on the growth substrate and at least one buffer layer based on a two-dimensional layered material.

According to a further embodiment of the growth substrate, the buffer layer is arranged in direct contact with the substrate. In particular, the buffer layer is bound to the substrate by weak Van der Waals forces.

According to a further embodiment of the growth substrate, the semiconductor layer forms a main surface of the growth substrate, said main surface being configured for the epitaxial growth of the epitaxial semiconductor layer sequence.

According to a further embodiment, the growth substrate comprises a plurality of buffer layers and a plurality of semiconductor layers or consists of a plurality of buffer layers and a plurality of semiconductor layers. Particularly preferably, the buffer layers and the semiconductor layers are arranged alternatingly. Preferably, each buffer layer is in direct contact with a semiconductor layer and vice versa.

In the following features and properties of the buffer layer and of the semiconductor layer are described in singular for the sake of simplicity. However, features and properties described in connection with one buffer layer or one semiconductor layer can be embodied for some or all buffer layers and/or semiconductor layers of the buffer layer sequence.

According to a further embodiment, the growth substrate is configured for the epitaxial growth of an epitaxial semiconductor layer sequence based on a nitride semiconductor compound material or consisting of a nitride semiconductor compound material. Nitride compound semiconductor materials are compound semiconductor materials containing nitrogen, such as the materials from the system $In_xAl_yGa_{1-x-y}N$ with $0 \leq x \leq 1$, $0 \leq y \leq 1$ and $x+y \leq 1$.

According to a further embodiment of the growth substrate, the buffer layer sequence comprises a plurality of semiconductor layers based on a nitride semiconductor compound material or formed from a nitride semiconductor compound material. Furthermore, the buffer layer sequence comprises a plurality of buffer layers. The semiconductor layers and the buffer layers comprised by the buffer layer sequence are arranged alternatingly. Such a growth substrate is particularly configured for the epitaxial growth of an epitaxial semiconductor layer sequence based on a nitride semiconductor compound material.

If the epitaxial semiconductor layer sequence to be grown on the growth substrate is based on a nitride semiconductor compound material or consists of a nitride semiconductor compound material, the semiconductor layer of the buffer layer sequence is preferably also based on a nitride semiconductor compound material or consists of a nitride semiconductor compound material.

Particularly preferably, an aluminium content of the semiconductor layers of the buffer layer sequence increases from the substrate, in particular in a linear or stepwise manner, to the main surface of the growth substrate intended for epitaxial growth in this case. For example, the aluminium content increases continuously within the semiconductor layers from the substrate to the main surface. In other words, the difference in the aluminium content of the semiconductor layers increases from the substrate to the main surface by the same amount.

Preferably, the semiconductor layer being furthest away from the substrate has an aluminium content which differs from the aluminium content of the epitaxial semiconductor layer sequence to be grown on the growth substrate by not less than 10%, preferably, by not less than 5%. Preferably, the semiconductor layer being furthest away from the substrate forms the main surface of the growth substrate, said main surface being intended for epitaxial growth.

Such a growth substrate is particularly configured for the epitaxial growth of an epitaxial semiconductor layer sequence based on a nitride compound semiconductor material having an high aluminium content. For example, the material of the epitaxial semiconductor layer sequence to be grown on the substrate has a ternary composition AlGaN.

In the case that the epitaxial semiconductor layer sequence to be grown on the growth substrate is based on a nitride semiconductor compound material or consists of a nitride semiconductor compound material, it is also possible that an indium content of the semiconductor layers of the buffer layer sequence increases from the substrate, in particular in a linear or stepwise manner, to the main surface of the growth substrate intended for epitaxial growth in this case. For example, the indium content increases continuously within the semiconductor layers from the substrate to the main surface. In other words, the difference in the indium content of the semiconductor layers increases from the substrate to the main surface by the same amount. Preferably, the semiconductor layer being furthest away from the substrate has an indium content which differs from the indium content of the epitaxial semiconductor layer sequence to be grown on the growth substrate by not less than 10%, preferably, by not less than 5%. Preferably, the semiconductor layer being furthest away from the substrate forms the main surface of the growth substrate, said main surface being intended for epitaxial growth.

Such a growth substrate is particularly configured for the epitaxial growth of an epitaxial semiconductor layer sequence based on a nitride compound semiconductor material having an high indium content. For example, the material of the epitaxial semiconductor layer sequence to be grown on the substrate has a ternary composition InGaN.

For example, the buffer layer comprises at least one of the following two-dimension layered materials or consists of at least one of the two-dimension layered materials: graphene, boron nitride (BN), $MoS_2$, $WSe_2$, fluorographene.

According to a further embodiment of the growth substrate the semiconductor layer of the buffer layer sequence is epitaxially grown. Particularly preferably, the semiconductor layer of the buffer layer sequence is epitaxially grown by MOVPE (short for: "metal organic vapor phase epitaxy").

Particularly preferably, the semiconductor layer and the buffer layer of the buffer layer sequence are deposited by the same method. In such a way it is possible to deposit all layers of the buffer layer sequence without changing a deposition chamber. Preferably, the buffer layer is epitaxially grown, for example, by MOVPE.

Furthermore, the buffer layer might be deposited by the help of PVD (short for: "physical vapour deposition"), CVD (short for: "chemical vapour deposition"), MBE (short for: "molecular beam epitaxy") or ALD (short for: "atomic layer deposition").

According to a further embodiment of the growth substrate, the semiconductor layer has a thickness between 1 Nanometer and 2 Micrometer, limits inclusive. In particular, the semiconductor layer has a thickness between 1 Nanometer and 1 Micrometer, limits inclusive.

According to a further embodiment of the growth substrate, the buffer layer has a thickness between 1.3 Nanometer and 500 Nanometer, limits inclusive. In particular, the buffer layer has a thickness between 1.3 Nanometer and 100 Nanometer, limits inclusive. For example, a lower limit of the buffer layer is given by the thickness of a monolayer of the respective two-dimensional material of the buffer layer.

According to a further embodiment of the growth substrate, the semiconductor layer of the buffer layer sequence is at least partially strain relaxed. This is particularly possible with advantage, since the buffer layer is based on a two-dimensional layered material. Two-dimensional layered materials allow the semiconductor layer to slide on the buffer layer.

According to a further embodiment of the growth substrate, the substrate comprises at least one of the following materials or consists of at least one of the following materials: sapphire, (In,Al,Ga)N, silicon, silicon carbide or a non-crystalline substrate such as glass.

The growth substrate described herein is configured for the epitaxial growth of an epitaxial semiconductor layer sequence. Particularly preferably, the epitaxial semiconductor layer sequence is part of an optoelectronic semiconductor body. In the following, a method for manufacturing the optoelectronic semiconductor body is described. Features, embodiments and developments of the growth substrate can also be embodied by the method, the semiconductor body and vice versa.

According to an embodiment of the method for manufacturing an optoelectronic semiconductor body, a growth substrate is provided.

According to a further embodiment of the method, an epitaxial semiconductor layer sequence based on a semiconductor compound material is epitaxially grown on a main surface of the growth substrate. The epitaxial semiconductor layer sequence comprises an active zone being configured for generating and/or detecting electromagnetic radiation. In particular, the epitaxial semiconductor layer sequence is bound to the growth substrate by weak Van der Waals forces.

According to a preferred embodiment, the method for manufacturing an optoelectronic semiconductor body comprises the following steps:

providing a growth substrate, epitaxial growing an epitaxial semiconductor layer sequence based on a semiconductor compound material on a main surface of the growth substrate, said epitaxial semiconductor layer sequence comprises an active zone being configured for generating and/or detecting electromagnetic radiation.

Preferably, the method steps are performed in the given order.

According to a further embodiment of the method, the epitaxial semiconductor layer sequence is removed from the growth substrate by exfoliating. After exfoliation, the growth substrate can be reused. For example, the exfoliating can be carried out with the help of a chuck. In particular, it is not necessary to use a complex method for removing the epitaxial semiconductor layer sequence from the growth substrate such as, for example, a laser lift-off method, since the layers of the buffer layer sequence are connected to each other by weak Van der Waals forces. It is possible that a part of the buffer layer sequence still remains at the epitaxial semiconductor layer sequence after removal of the growth substrate.

According to a further embodiment of the method, the epitaxial semiconductor layer sequence is based on a nitride semiconductor compound material with the chemical formula $In_xAl_yGa_{1-x-y}N$ with $0 \leq x \leq 1$, $0 \leq y \leq 1$ and $x+y \leq 1$. In that case the active zone can be configured to emit and/or detect electromagnetic radiation with a wavelength between 200 Nanometer and 1770 Nanometer, limits inclusive. Particularly, electromagnetic radiation with wavelength in the UV region is generated and/or detected by active regions based on AlN, while electromagnetic radiation with wavelength in the IR region is generated and/or detected by active regions based on InN. Particularly, electromagnetic radiation with wavelength in the visible region is generated and/or detected by active regions based on a nitride semiconductor compound material comprising In, Al and Ga.

According to a further embodiment of the method during providing the growth substrate a substrate is provided. On the substrate a buffer layer sequence is deposited. Preferably, the deposition of the buffer layer sequence takes place in the same deposition chamber as the epitaxial growth of the epitaxial semiconductor layer sequence. At this embodiment of the method, the layers of the buffer layer sequence, namely the semiconductor layer and the buffer layer are grown by the same method. Preferably, the layers of the buffer layer sequence are grown by MOVPE. Further, it is also possible that the layers of the buffer layer sequence and the epitaxial semiconductor layer sequence are grown by different methods. If this is the case, the layers of the buffer layer sequence and the epitaxial semiconductor layer sequence are deposited in different deposition chambers. In particular, also the semiconductor layer of the buffer layer sequence and the buffer layer of the buffer layer sequence are deposited by different methods and in different deposition chambers, if this is the case.

According to a further embodiment of the method, a substrate is provided. On the substrate a buffer layer sequence is deposited. Preferably, depositing a plurality of buffer layers of the buffer layer sequence takes place in a different deposition chambers. In particular, the buffer layer of the buffer layer sequence and the semiconductor layer of the buffer layer sequence are deposited in different deposition chambers.

According to a further embodiment of the method, the epitaxial semiconductor layer sequence is arranged on a carrier. The carrier is configured to mechanically stabilize the epitaxial semiconductor layer sequence. The carrier can be fixed to the epitaxial semiconductor layer sequence before or after removal from the growth substrate. Preferably, the carrier is fixed to the epitaxial semiconductor layer sequence before removal of the growth substrate. The carrier can be embodied as a carrier wafer.

Particularly preferably, the growth substrate disclosed herein enables an improved epitaxial growth of a epitaxial semiconductor layer sequence, in particular comprising hetero structures.

The semiconductor body, which is produced by the method described herein, might be configured to be part of a light-emitting diode, a laser diode or a detector for electromagnetic radiation such as a photodiode.

In general, no growth substrates for the growth of epitaxial semiconductor layer sequences based on compound semiconductor materials with the same lattice constant as the lattice constant of the epitaxial semiconductor layer sequence are available. Commonly, growth substrates are used having a lattice constant different from the lattice constant of the epitaxial semiconductor layer sequence to be grown. This leads to a mismatch in the lattice parameters lowering crystal quality of the epitaxial semiconductor layer sequence.

Inter alia, the present growth substrate is based on the idea that with the help of the semiconductor layers of the buffer layer sequence, the lattice constant of the semiconductor material comprised by the buffer layer sequence can be adapted stepwise from the substrate to a main surface of the growth substrate. In such a way, the lattice mismatch between the material of the epitaxial semiconductor layer sequence to be grown and the growth substrate can be reduced. This leads to an epitaxial semiconductor layer sequence having improved crystal quality.

Further, strain relaxation within the buffer layer sequence, for example due to the different material composition of the semiconductor layers, preferably takes place by sliding of the semiconductor layers on the buffer layers, which is enabled by the nature of the two-dimensional layered materials of the buffer layers, which are bound to the respective adjacent semiconductor layers only by weak Van der Waals forces.

Particularly preferably, it is possible to provide a growth substrate for improved epitaxial growth of an epitaxial semiconductor layer sequence based on a nitride semiconductor compound material having a high indium content or a high aluminium content. Particularly, growth substrates for the growth of such epitaxial semiconductor layer sequences comprises buffer layer sequences, wherein the indium content or the aluminium content of the semiconductor layers of the buffer layer sequence increases stepwise, starting from the substrate to the main surface of the growth substrate.

BRIEF DESCRIPTION OF THE DRAWINGS

Further advantageous embodiments and developments of the growth substrate and the method for manufacturing an optoelectronic semiconductor body result from the exemplary embodiment described below in connection with the Figures.

DETAILED DESCRIPTION OF ILLUSTRATIVE EMBODIMENTS

Equal or similar elements as well as elements of equal function are designated with the same reference signs in the Figures. The Figures and the proportions of the elements shown in the Figures are not regarded as being shown to scale. Rather, single elements, in particular layers, can be shown exaggerated in magnitude for the sake of better presentation and/or better understanding.

Figure 1:
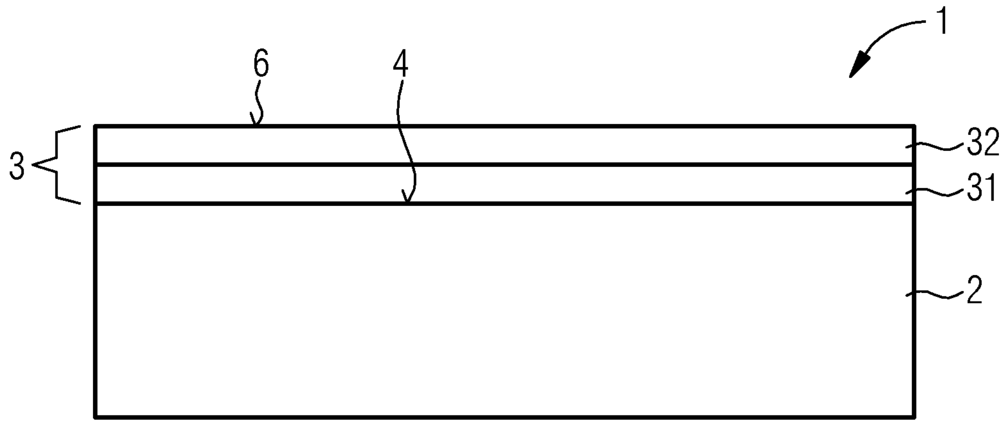
FIG. 1 shows a schematic sectional view of a growth substrate according to an exemplary embodiment.

The growth substrate 1 according to the exemplary embodiment of FIG. 1 comprises a substrate 2. The substrate 2 might comprise or consists of sapphire, silicon, silicon carbide, (In,Al,Ga)N or a nanocrystalline material such as glass.

Furthermore, the growth substrate 1 according to the exemplary embodiment of FIG. 1 comprises a buffer layer sequence 3. The buffer layer sequence 3 is arranged in direct contact on the substrate 2. The buffer layer sequence 3 of the growth substrate 1 according to the exemplary embodiment of FIG. 1 is formed from one single buffer layer 31 and one single semiconductor layer 32.

The buffer layer 31 is arranged in direct contact with a main surface 4 of the substrate 2. The buffer layer 31 comprises a two-dimensional layered material or consists of a two-dimensional layered material. For example, the buffer layer 31 comprises or consists of at least one of the following two-dimensional layered materials: graphene, boron nitride, $MoS_2$, $WSe_2$, fluorographene.

The semiconductor layer 32 of the buffer layer sequence 3 according to the exemplary embodiment of FIG. 1 is positioned in direct contact on the buffer layer 31. The semiconductor layer 32 of the buffer layer sequence 3 comprises or consists of a semiconductor compound material. For example, the semiconductor layer 32 comprises or consists of a nitride semiconductor compound material. In particular, the semiconductor layer 32 comprises or consists of a semiconductor compound material of the same material system as the epitaxial semiconductor layer sequence 5 to be grown on the growth substrate 1.

Further, the growth substrate 1 of the exemplary embodiment of FIG. 1 has a main surface 6 onto which the epitaxial semiconductor layer sequence 5 will be grown. The main surface 6 of the growth substrate 1 is formed by a surface of the semiconductor layer 32. Further, the main surface 6 of the growth substrate 1 is freely accessible.

Figure 2:
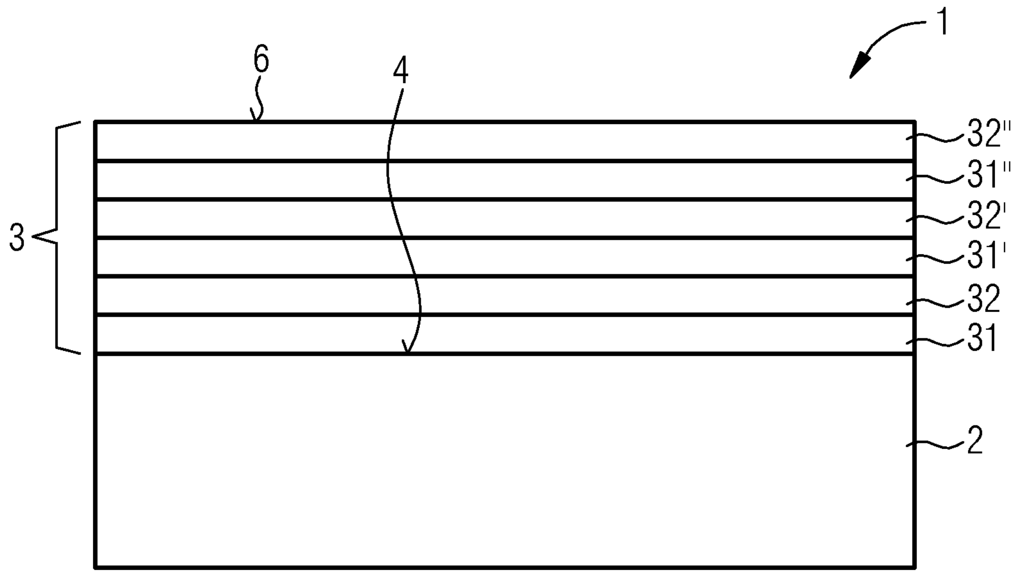
FIG. 2 shows a schematic sectional view of a growth substrate according to a further exemplary embodiment.

The growth substrate 1 according to the exemplary embodiment of FIG. 2 also comprises a substrate 2, for example comprising or consisting of sapphire, silicon carbide, glass or some other already mentioned material.

Further, the growth substrate 1 according to the exemplary embodiment of FIG. 2 comprises a buffer layer sequence 3 arranged on a main surface 4 of the substrate 2. At present, the buffer layer sequence 3 is deposited in direct contact on a main surface 4 of the substrate 2.

The buffer layer sequence 3 of the growth substrate 1 according to the exemplary embodiment of FIG. 2 comprises three buffer layers 31, 31', 31", each comprising or consisting of boron nitride. It is also possible that the buffer layers 31, 31', 31" of the buffer layer sequence 3 comprise or consists another two-dimensional layered material. Further, it is possible that the buffer layer sequence 3 comprises more or less than three buffer layers 31, 31', 31". In particular, the buffer layers 31, 31', 31" of the buffer layer sequence 3 can comprise or consist of different two-dimensional layered materials. For example, some of the buffer layers 31 of the buffer layer sequence 3 comprise or consist of graphene, while other buffer layers 31 of the buffer layer sequence 3 comprise or consist of boron nitride.

Furthermore, the buffer layer sequence 3 comprises three semiconductor layers 32, 32', 32". Further, it is possible that the buffer layer sequence 3 comprises more or less than three semiconductor layers 32, 32', 32". Preferably, the number of the buffer layers 31 of the buffer layer sequence 3 and the number of the semiconductor layers 32 of the buffer layer sequence 3 are equal. The semiconductor layers 32 and the buffer layers 31 are arranged alternatingly with each other.

Further, one buffer layer 31 is arranged directly adjacent to the substrate 2, while a main surface 6 of the growth substrate 1 intended for epitaxial growth of an epitaxial semiconductor layer sequence 5 is formed by a semiconductor layer 32".

Each of the semiconductor layers 32, 32', 32" of the buffer layer sequence 3 comprises or consists of a nitride compound semiconductor material. At present, the semiconductor layers 32, 32', 32" of the buffer layer sequence 3 comprise or consist of InGaN. In particular, the indium content of the semiconductor layers 32, 32', 32" is increasing with the distance to the substrate 2. In other words, the semiconductor layer 32 closest to the substrate 2 has the lowest indium content, while the semiconductor layer 32" arranged at a largest distance from the substrate 2 has the highest indium content.

The semiconductor layer 32 closest to the substrate 2 has a material composition $In_xGa_{1-x}N$, while the semiconductor layer 32" having the largest distance to the substrate 1 has a material composition of $In_zGa_{1-z}N$. The semiconductor layer 32' in between has a material composition of $In_yGa_{1-y}N$. Furthermore, the relation is $x<y<z$ valid.

Alternatively, the semiconductor layers 32, 32', 32" of the buffer layer sequence 3 comprise or consist of AlGaN. In particular, the aluminium content of the semiconductor layers 32, 32', 32" is increasing with the distance to the substrate 2. In other words, the semiconductor layer 32 closest to the substrate 2 has the lowest aluminium content, while the semiconductor layer 32" arranged at the largest distance to the substrate 2 has the highest aluminium content.

The semiconductor layer 32 closest to the substrate 2 has a material composition $Al_xGa_{1-x}N$, while the semiconductor layer 32" having the largest distance to the substrate 2 has a material composition of $Al_zGa_{1-z}N$. The semiconductor layer 32' in between has a material composition of $Al_yGa_{1-y}N$. Furthermore, the relation is $x<y<z$ valid. It is also possible that $z<y<x$ is valid.

Figure 3:
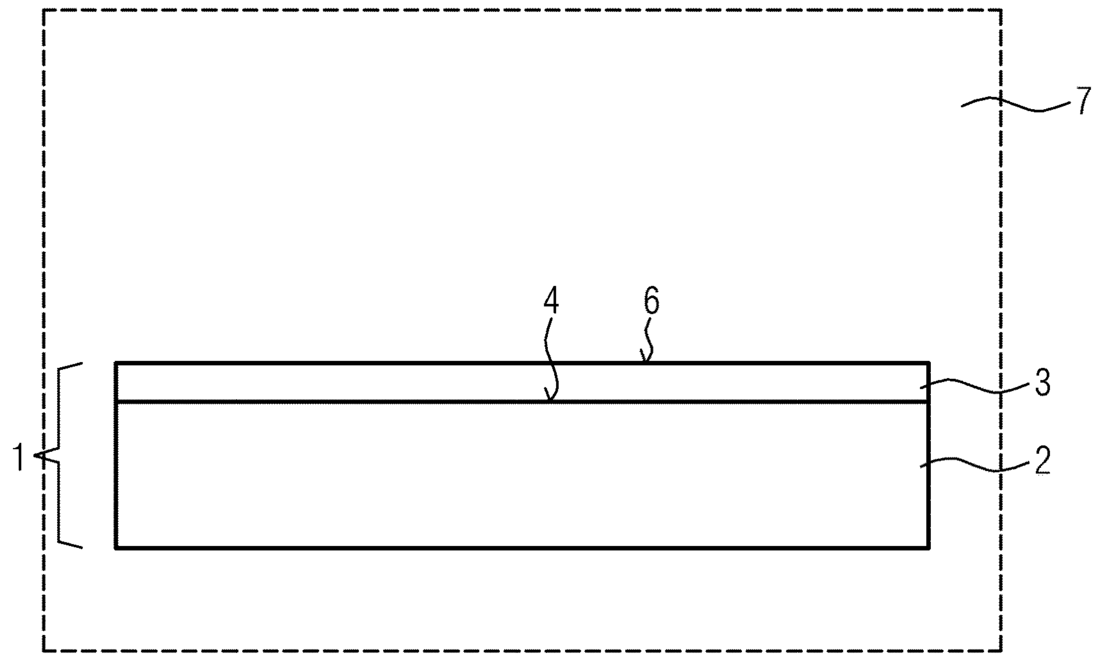
FIG. 3 shows a schematic sectional view of a stage of a method for producing a semiconductor body according to an exemplary embodiment.

In a first step of the method of the exemplary embodiment of FIGS. 3 to 7, a growth substrate 1 is provided in a first step, for example in a deposition chamber 7 (FIG. 3). The growth substrate 1 might be embodied as, for example, already described in connection with FIGS. 1 and 2.

The growth substrate 1 comprises a buffer layer sequence 3 with a plurality of buffer layers 31 and a plurality of semiconductor layers 32. The buffer layers 31 and the semiconductor layers 32 are arranged alternatingly. The semiconductor layers 32 are formed from a semiconductor compound material, while the buffer layers 31 are formed from a two-dimensional layered material.

The growth substrate 1 has a main surface 6 intended for the growth of an epitaxial semiconductor layer sequence 5. The main surface 6 intended for the growth of the epitaxial semiconductor layer sequence 5 is formed from the material of one of the semiconductor layers 32. A lattice constant of the material of the main surface 6 intended for the growth of the epitaxial semiconductor layer sequence 5 is similar to a lattice constant of the epitaxial semiconductor layer sequence 5 to be grown on the main surface 6 of the growth substrate 1.

Figure 4:
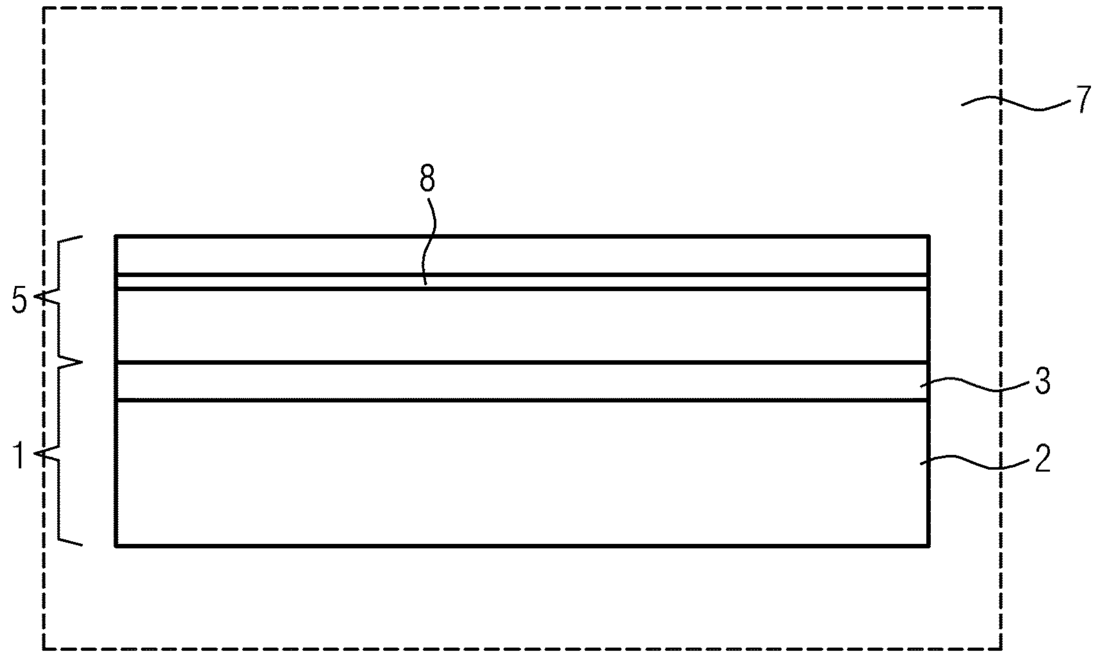
FIG. 4 shows a further schematic sectional view of a stage of a method according to an exemplary embodiment.

After providing the growth substrate 1 in the deposition chamber 7, an epitaxial semiconductor layer sequence 5 based on a compound semiconductor material is epitaxially grown on the main surface 6 of the growth substrate 1 (FIG. 4).

For example, the buffer layer sequence 3 is deposited in the deposition chamber 7 prior to the growth of the epitaxial semiconductor layer sequence 5 without leaving the deposition chamber 7. In this case, the layers of the buffer layer sequence 3, namely the semiconductor layers 32 and the buffer layers 31 are grown by the same method as the epitaxial semiconductor layer sequence 5, preferably by MOVPE.

Alternatively, it is also possible to deposit the layers of the buffer layer sequence 3 and the epitaxial semiconductor layer sequence 5 by different deposition methods. For example, the layers of the buffer layer sequence 3 are deposited by PVD, CVD, ALD and/or MBE, while the epitaxial semiconductor layer sequence 5 is deposited by MOVPE.

The epitaxial semiconductor layer sequence 5 comprises an active zone 8, which is configured to emit or to detect electromagnetic radiation during operation. The active zone 8 comprises for example a pn-transition, a double hetero structure, a single quantum structure or a multi quantum structure for the generation and/or detection of the electromagnetic radiation. Here, the term "quantum structure" means quantum wells, quantum wires as wells as quantum dots.

At present, the epitaxial semiconductor layer sequence 5 grown on the main surface 6 of the growth substrate 1 is based on a nitride compound semiconductor material. Further, the semiconductor layers 32 of the buffer layer sequence 3 are also based on a nitride compound semiconductor material.

Figure 5:
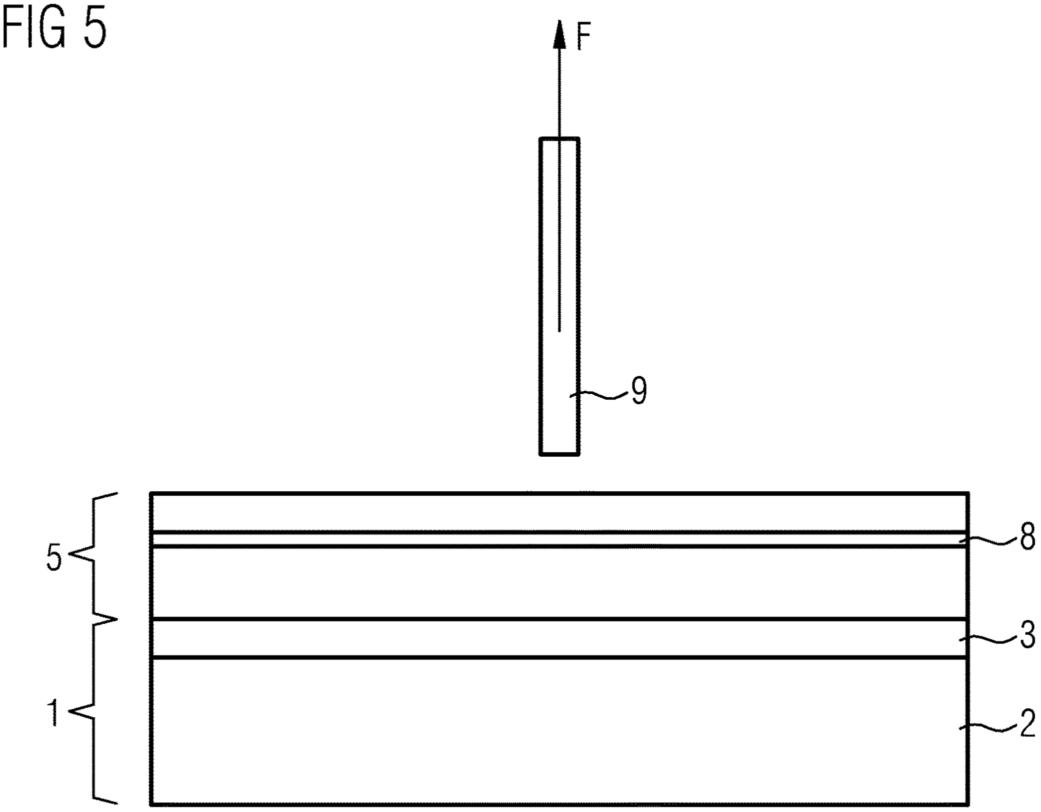
FIG. 5 shows a further schematic sectional view of a stage of a method for producing a semiconductor body according to an exemplary embodiment.

In a next step, which is schematically shown in FIG. 5, the epitaxial semiconductor layer sequence 5 is removed from the deposition chamber 7 and is mechanically removed, for example exfoliated, from the growth substrate 1, for example with the help of a chuck 9. The chuck 9 adheres to the epitaxial semiconductor layer sequence 5 with the help of vacuum and applies a force F such that the epitaxial semiconductor layer sequence 5 is removed from the growth substrate 1.

During the exfoliation process it is possible that a part of the buffer layer sequence 3 still remains at the epitaxial semiconductor layer sequence 5. In other words, it is possible that a separation due to the applied force F by the chuck 9 takes place within the buffer layer sequence 3.

Figure 6:
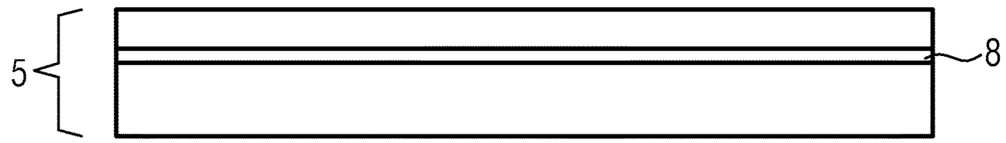
FIG. 6 shows a further schematic sectional view of a further stage of a method for producing a semiconductor body according to an exemplary embodiment.

As shown schematically in FIG. 6, after exfoliation of the epitaxial semiconductor layer sequence 5 from the growth substrate 1, the epitaxial semiconductor layer sequence 5 is separated from the growth substrate 1.

Figure 7:
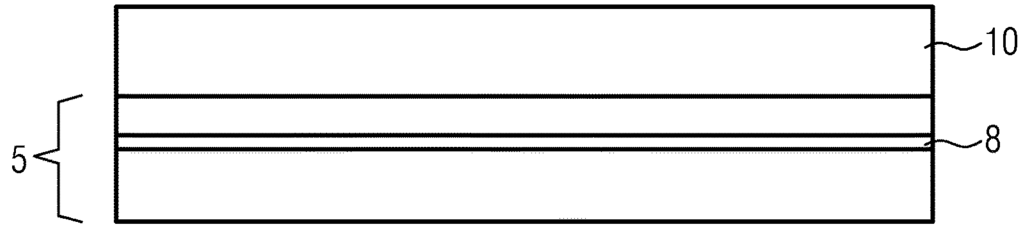
FIG. 7 shows a further schematic sectional view of a further stage of a method for producing a semiconductor body according to an exemplary embodiment.

Before or after the exfoliation it is possible that the epitaxial semiconductor layer sequence 5 is arranged on a carrier 10 (FIG. 7). The carrier 10 is configured to mechanically stabilize the epitaxial semiconductor layer sequence 5. For example, the carrier is fixed to the epitaxial semiconductor layer sequence 5 by the help of a joining layer (not shown). The semiconductor body manufactured by the method according to the exemplary embodiment of FIGS. 3 to 7 comprises the epitaxial semiconductor layer sequence 5 and the carrier 10.

The features and exemplary embodiments described in connection with the Figures can be combined with each other according to further exemplary embodiments, even if not all combinations are explicitly described. Furthermore, the exemplary embodiments described in connection with the Figures may alternatively or additionally have further features according to the description in the general part.

The invention is not limited to the description of the embodiments. Rather, the invention comprises each new feature as well as each combination of features, particularly each combination of features of the claims, even if the feature or the combination of features itself is not explicitly given in the claims or embodiments.

The invention claimed is:

1. An arrangement comprising:

a substrate; and a buffer layer sequence arranged on the substrate and comprising a plurality of semiconductor layers based on a nitride semiconductor compound material and a plurality of buffer layers, wherein the plurality of semiconductor layers and the plurality of buffer layers are arranged alternatingly, wherein the plurality of buffer layers comprises at least one of the following two-dimensional layered materials: graphene, boron nitride, MoS2, WSe2 or fluorographene, and wherein the plurality of semiconductor layers is grown on the substrate; and an epitaxial semiconductor layer sequence arranged on the buffer layer sequence, wherein the epitaxial semiconductor layer sequence is grown on the substrate and the buffer layer sequence, and wherein an aluminum content of the plurality of semiconductor layers increases from the substrate in a linear or stepwise manner.

2. The arrangement according to claim 1, wherein the epitaxial semiconductor layer sequence is based on a III/V semiconductor compound material or based on a II/VI semiconductor compound material.

3. The arrangement according to claim 1, wherein the epitaxial semiconductor layer sequence is based on the nitride semiconductor compound material.

4. The arrangement according to claim 3, wherein the substrate comprises (In,Al,Ga)N.

5. The arrangement according to claim 3, wherein the substrate comprises silicon.

6. The arrangement according to claim 3, wherein the substrate comprises silicon carbide.

7. The arrangement according to claim 3, wherein the substrate comprises glass.

8. The arrangement according to claim 1, wherein an indium content of the semiconductor layers increases from the substrate in a linear or stepwise manner.

9. The arrangement according to claim 1, wherein the semiconductor layers of the buffer layer sequence are epitaxially grown.

10. The arrangement according to claim 1, wherein the semiconductor layers have a thickness between 1 nanometer and 2 micrometer, inclusive.

11. The arrangement according to claim 1, wherein the buffer layers have a thickness between 1.3 nanometer and 500 nanometer, inclusive.

12. The arrangement according to claim 3, wherein the substrate comprises sapphire, (In,Al,Ga)N, silicon, silicon carbide, or glass.

13. The arrangement according to claim 1, wherein the semiconductor layers of the buffer layer sequence are strain relaxed.

14. A method for manufacturing an optoelectronic semiconductor body, the method comprising:

providing a growth substrate by:

providing a substrate; and depositing a buffer layer sequence on the substrate, the buffer layer sequence comprising a plurality of semiconductor layers based on a nitride semiconductor compound material and a plurality of buffer layers, wherein the plurality of semiconductor layers and the plurality of buffer layers are arranged alternatingly, wherein the plurality of semiconductor layers is grown on the substrate, and wherein the buffer layers comprise at least one of the following two-dimensional layered materials: graphene, boron nitride, MoS2, WSe2 or fluorographene; and epitaxially growing a semiconductor layer sequence based on a semiconductor compound material on a main surface of the growth substrate, the main surface being formed by an outermost one of the plurality of semiconductor layers of the buffer layer sequence, wherein the epitaxially grown semiconductor layer sequence comprises an active zone for generating and/or detecting electromagnetic radiation, and wherein an aluminum content of the plurality of semiconductor layers increases from the substrate in a linear or stepwise manner.

15. The method according to claim 14, further comprising, after epitaxially growing the semiconductor layer sequence, removing the epitaxially grown semiconductor layer sequence from the growth substrate by exfoliating.

16. The method according to claim 14, further comprising arranging the epitaxially grown semiconductor layer sequence on a carrier.

17. The method according to claim 14, wherein the active zone is configured to generate and/or detect electromagnetic radiation with a wavelength between 200 nanometer and 1,770 nanometer, inclusive.

18. The method according to claim 14, wherein depositing the buffer layer sequence takes place in the same deposition chamber as epitaxially growing the semiconductor layer sequence.

19. The method according to claim 14, wherein depositing the plurality of buffer layers of the buffer layer sequence and epitaxially growing the plurality of semiconductor layers of the buffer layer sequence take place in different deposition chambers.

20. An arrangement comprising:

a substrate; and a buffer layer sequence arranged on the substrate and comprising a plurality of semiconductor layers based on a nitride semiconductor compound material and a plurality of buffer layers, wherein the plurality of semiconductor layers and the plurality of buffer layers are arranged alternatingly, wherein the plurality of buffer layers comprises at least one of the following two-dimensional layered materials: graphene, boron nitride, MoS2, WSe2 or fluorographene, and wherein the plurality of semiconductor layers is grown on the substrate; and an epitaxial semiconductor layer sequence arranged on the buffer layer sequence, wherein the epitaxially grown semiconductor layer sequence is grown on the substrate and the buffer layer sequence, and wherein an indium content of the plurality of semiconductor layers increases from the substrate in a linear or stepwise manner.

* * * * *